United States Patent
Yamaguchi et al.

(10) Patent No.: US 7,022,463 B2
(45) Date of Patent: Apr. 4, 2006

(54) NEAR-FIELD EXPOSURE PHOTORESIST AND FINE PATTERN FORMING METHOD USING THE SAME

(75) Inventors: Takako Yamaguchi, Atsugi (JP); Ryo Kuroda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/921,184

(22) Filed: Aug. 19, 2004

(65) Prior Publication Data

US 2005/0079437 A1    Apr. 14, 2005

(30) Foreign Application Priority Data

Aug. 22, 2003 (JP) ............... 2003/298973

(51) Int. Cl.
*G03F 7/30* (2006.01)
*G03F 7/023* (2006.01)

(52) U.S. Cl. ............. 430/291; 430/165; 430/192; 430/313; 430/316; 430/317

(58) Field of Classification Search ........ 430/165, 430/191, 192, 193, 291, 317, 326, 313, 316
See application file for complete search history.

(56) References Cited

U.S. PATENT DOCUMENTS

| 3,929,488 | A | * | 12/1975 | Smith ............... 430/176 |
| 4,296,194 | A | * | 10/1981 | Harper et al. ......... 430/176 |
| 4,404,272 | A | * | 9/1983 | Stahlhofen .......... 430/192 |
| 5,338,643 | A | * | 8/1994 | Kanazawa et al. ...... 430/190 |
| 5,667,931 | A | * | 9/1997 | Lee et al. ........... 430/191 |
| 6,171,730 | B1 | | 1/2001 | Kuroda et al. ........ 430/5 |
| 6,303,277 | B1 | * | 10/2001 | Hieda et al. ......... 430/322 |
| 6,721,040 | B1 | * | 4/2004 | Saito et al. ......... 355/69 |
| 6,849,391 | B1 | * | 2/2005 | Yamaguchi et al. .... 430/326 |
| 2004/0137338 | A1 | | 7/2004 | Inao et al. .......... 430/5 |

FOREIGN PATENT DOCUMENTS

| EP | 549339 | * | 6/1993 |
| JP | 1077051 | * | 3/1988 |
| JP | 3225343 | * | 10/1991 |
| JP | 5232695 | * | 9/1993 |
| JP | 6348039 | * | 12/1994 |
| JP | 7-106229 | | 4/1995 |

* cited by examiner

*Primary Examiner*—John S. Chu
(74) *Attorney, Agent, or Firm*—Fitzpatrick, Cella, Harper & Scinto

(57) ABSTRACT

A near-field photoresist for formation of a fine pattern with by near-field exposure includes an alkali-soluble novalac resin, a diazyde-type photosensitizer which is photoreactive by near-field exposure, a photoacid generator which generates acid by the near-field exposure, and a solvent.

11 Claims, 3 Drawing Sheets

NEAR-FIELD EXPOSURE PHOTORESIST AND FINE PATTERN FORMING METHOD USING THE SAME

FIELD OF THE INVENTION AND RELATED ART

The present invention relates to an near-field exposure photoresist and a fine pattern forming method using the near-field exposure photoresist.

In recent years, with the progress of an increase in capacity of a semiconductor memory and a high-speed and high-integrated CPU (central processing unit), smaller photolithography has been further required. For this purpose, a wavelength of light used in a photolithographic apparatus is made shorter, and a ultraviolet laser has been presently used, thus permitting fine patterning of about 0.1 µm. However, in order to effect further fine patterning, there are many problems to be solved, such as a shorter wavelength of laser light, development of lens which can be used in such a shorter wavelength region, and a compact apparatus.

On the other hand, a method using near-field light has been proposed in order to effect formation of a photoresist pattern having a width of not more than a light wavelength by using light.

For example, Japanese Laid-Open Patent Application Hei 7-106229 has disclosed a near-field exposure method employing scanning with a probe of optical fiber having a tip which has been sharpened by wet etching. Further, in order to solve a problem of low throughput, U.S. Pat. No. 6,171,730 has proposed a simultaneous near-field exposure using a mask.

The near-field exposure has the advantage of determining an available minimum pattern width depending on a probe used or an opening diameter of a mask used, irrespective of a wavelength of light. Accordingly, it becomes possible to form a fine pattern of not more than 0.1 µm without using a large-sized and expensive light source, such as an excimer laser. As an light source for exposure, it is also possible to employ a compact and inexpensive mercury lamp or blue semiconductor laser.

As described above, the near-field exposure is advantageous for realization of fine pattern without using shorter wavelength light. However, a photoresist is exposed to scattered light which is created by disturbing near-field light by the photoresist, so that a resultant width of a formed pattern is increased when the thickness of the photoresist for image formation is large. As a result, the patternwidth tends to become larger. FIGS. 4(a) and 4(b) shows such a state. In these Figures, as a mask, a light blocking film 205 is formed on a mask base material 204. Near-field light 510 is created in the vicinity of a small opening 513 by causing exposure light 505 to enter a mask provided with the small opening 513 (FIG. 4(a)).

When the mask and a photoresist 503 are close to each other (FIG. 4(b)), the near-field light 510 is scattered by the photoresist 503 on a substrate 504. As a result, a photoresist reactive portion 501 is formed in the photoresist 503.

In the case where the photoresist 503 has a large thickness, when an amount of exposure is increased in order to effect exposure of the substrate in the thickness direction of the photoresist 503, the photoresist reactive portion 501 is broadened toward the surface of the substrate 504, thus providing a larger width of a pattern to be formed. Further, when a spacing between small openings is small, respective photoresist reactive portions from associated small openings overlap with each other, thus further broaden the line width of pattern to be formed. Further, it is necessary to decrease an amount of exposure when the fine pattern is intended to be formed. In such a case, however, there is a possibility that the pattern is formed only up to a smaller depth position of an upper layer portion of the photoresist.

For this reason, in order to form the fine pattern by near-field exposure, it is desirable that the photoresist has a thickness smaller than a minimum opening diameter of an opening through which the exposure light passes.

However, in the case of the above described thinner photoresist, a resistance to etching is lowered during transfer of pattern onto the substrate. Accordingly, when a finer pattern is formed, there is a possibility that a process tolerance is lowered during the pattern transfer onto the substrate or that the pattern transfer onto the substrate is failed with respect to such a substrate that it requires the use of gas or system providing an insufficient latitude in selection of the photoresist.

SUMMARY OF THE INVENTION

An object of the present invention is to provide a near-field exposure photoresist capable of effecting transfer of a resist pattern formed at a high contrast and a high aspect ratio onto a workpiece substrate with a process tolerance.

Another object of the present invention is to provide a fine pattern forming method using the near-field exposure photoresist.

According to the present invention, there is provided a near-field photoresist for formation of a fine pattern with near-field exposure, comprising: an alkali-soluble novolac resin, a diazide-type photosensitizer which is photoreactive by the near-field exposure, a photoacid generator which generates acid by near-field exposure, and a solvent.

In the photoresist of the present invention, the alkali-soluble novolac resin may preferably be synthesized through condensation of a phenol component with an aldehyde component in the presence of an acid catalyst. The diazide-type photosensitizer may preferably be a compound capable of being synthesized through esterification between a poly-hydroxy compound and quinonediazide sulfonic acid as a photosensitive group. The photoacid generator may preferably be an onium salt or triazine. The solvent may preferably be a single solvent or a mixture solvent selected from the group consisting of propylene glycol monomethyl ether acetate, ethyl lactate, butyl acetate, and 2-heptanone.

According to the present invention, there is also provided a fine pattern forming method for transferring a fine pattern onto a workpiece substrate by means of an exposure mask provided with the fine pattern, comprising:

a step of preparing the exposure mask provided with the fine pattern, a step of preparing a near-field exposure photoresist comprising an alkali-soluble novolac resin, a diazide-type photosensitizer which is photoreactive by near-field exposure, a photoacid generator which generates acid by the near-field exposure, and a solvent, a step of disposing the near-field exposure photoresist on the workpiece substrate, a step of silylating an upper layer portion of the near-field exposure photoresist, a step of forming a fine pattern at the silylated portion of the photoresist by effecting the near-field exposure, and a step of forming the fine pattern on the workpiece substrate on the basis of the fine pattern.

According to the present invention, there is further provided a fine pattern forming method, comprising:

a step of applying on a workpiece substrate an near-field exposure photoresist comprising an alkali-soluble novolac resin, a diazide-type photosensitizer which is photoreactive by near-field exposure, a photoacid generator which generates acid by the near-field exposure, and a solvent, a step of silylating an upper layer portion of the photoresist in a vapor phase or a liquid phase, a step of forming a latent image pattern at the silylated portion of the photoresist by exposing the silylated portion to near-field light, a step of developing the latent image pattern formed at the silylated portion with alkali developer, a step of transferring the developed pattern at the silylated portion onto the photoresist in a thickness direction of the photoresist by oxygen dry etching, and a step of transferring the transferred photoresist pattern onto the substrate by dry etching.

In the fine pattern forming method of the present invention, in the silylating step, the thickness of the silylated portion may preferably be not more than a size of an opening diameter of a small opening of a mask for use in near-field exposure.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Figure 1:
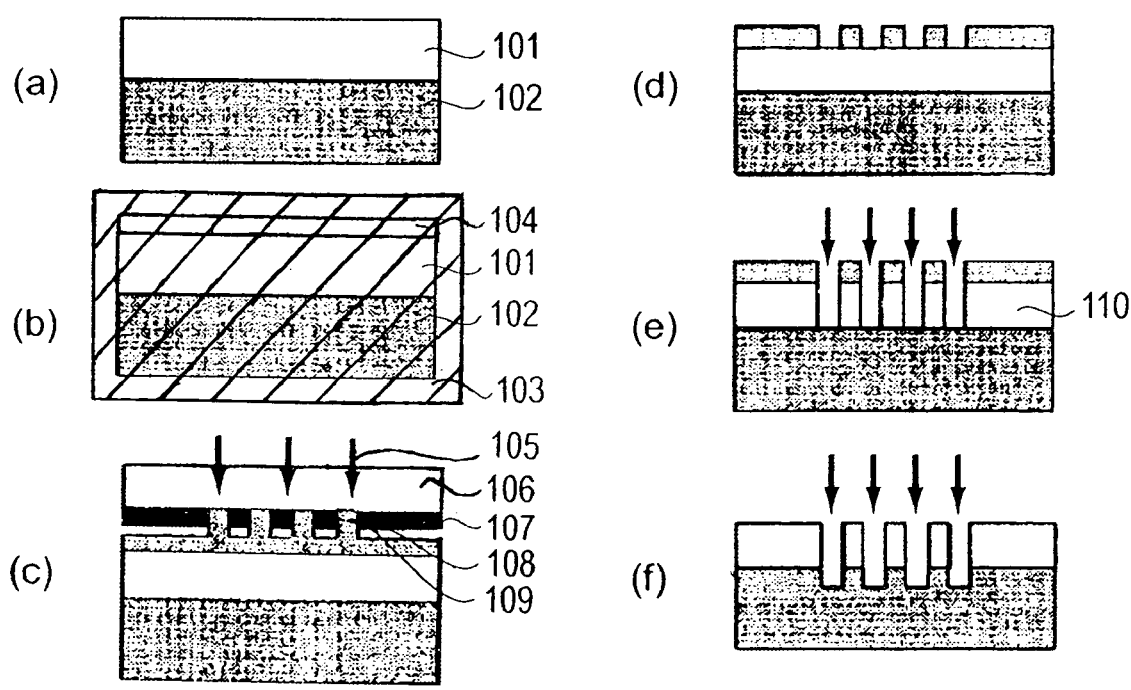
FIGS. 1(a) to 1(f) are views for illustrating a fine pattern forming method as an embodiment of the present invention.

The photoresist according to the present invention includes an alkali-soluble novolac resin, a diazide-type photosensitizer which is reactive by near-field exposure, a photoacid generator which generates acid by near-field exposure, and a solvent.

The alkali-soluble novolac resin may, e.g., be prepared by synthesized through condensation between a phenolic component and an aldehyde component in the presence of an acid catalyst, dissolving the synthesized alkali-soluble novolac resin in a polar solvent including alcohols, such as methanol and ethanol; ketones, such as methyl ethyl ketone; and cyclic ethers, such as dioxane and tetrahydrofuran, and being added in a nonpolar solvent, such as a water-polar solvent mixture, heptane or hexane to precipitate a resinous content. Alternatively, it is also possible to prepare the alkali-soluble novolac resin, e.g., by batch-wise or successively adding the aldehyde component during the reaction of the phenolic component with the aldehyde component to control the condensation reaction.

As the phenolic component used for synthesizing the alkali-soluble novolac resin used in this embodiment, it is possible to use phenol; m-cresol; p-cresol; o-cresol; xylenols, such as 2,5-xylenol and 3,5-xylenol; m-ethylphenol; p-ethylphenol; o-ethylphenol; 2,3,5-trimethylphenol; butylphenol; hydroquinone; dihydroxydiphenylpropane trimethyl-phenol; propylphenol; and dihydroxybenzene. These phenols may be used singly or in mixture of two or more species.

As the aldehyde component, it is possible to use formaldehyde, paraformaldehyde, acetaldehyde, benzaldehyde, phenylacetaldehyde, and furfural. As the acid catalyst, it is possible to use hydrochloric acid, sulfuric acid, formic acid, and oxalic acid.

The above described aldehyde component may be used in an amount of 0.7–3 mol per 1 mol of the phenolic component, depending on a reaction condition. The acid catalyst may generally be used in an amount of $1 \times 10^{-4} - 5 \times 10^{-3}$ mol per 1 mol of the phenolic component. Further, the reaction temperature may ordinarily be 10–200° C., preferably 70–130° C.

The alkali-soluble novolac resin used in the present invention may have various substituents so long as they impair an alkali solubility of the resultant resin.

The diazide-type photosensitizer used in this embodiment is a compound which can be synthesized through an esterification between a polyhydroxy compound and quinonediazide sulfonic acid as a photosensitive group.

As the polyhydroxy compound, it is possible to use, 2,3,4-trihydroxylbenzophenone; 2,3,4'-trihydroxybenzophenone; 2,4,6-trihydroxybenzophenone; and 2,3,4,4'-tetrahydroxybenzophenone.

As the quinonediazide sulfonic acid, it is possible to use benzoquinone-1,2-diazide-4-sulfonic acid and naphthoquinone-1,2-diazide sulfonic acids, such as naphthoquinone-1,2-diazide-4-sulfonic acid and naphthoquinone-1,2-diazide-5-sulfonic acid.

As the photoacid generator used in this embodiment, it is possible to use onium salts, such as iodonium salt and sulfonium salt; and triazine. Further, in the case where the photoacid generator alone has a poor acid generating efficiency to become problematic, it is possible to use a sensitizer, such as 2-ethyl-9,10-dimethyloxyanthracene, in combination.

A photoresist in this embodiment is prepared by dissolving the above prepared alkali-soluble novolac resin, the photosensitizer, and the photoacid generator in a solvent.

As the solvent, it is possible to use any solvent in which the alkali-soluble novolac resin, the photosensitizer and the photoacid generator can be dissolved. From the viewpoint of safety, it is desirable that PGMEA (propylene glycol monomethyl ether acetate), ethyl lactate, butyl acetate, and 2-heptanone are used singly or in mixture of two or more species.

The above prepared positive photoresist for near-field exposure in this embodiment may further contain known additives including an alkali-soluble resin other than the alkali-soluble novolac resin, another sensitizer, a surfactant, a colorant, an adhesive acid, a storage stabilizer, an antifoaming agent, etc., as desired.

By using the thus prepared photoresist, a fine pattern is transferred onto a substrate in the following manner.

With reference to FIG. 1, a fine pattern forming method in this embodiment will be described.

On a workpiece substrate 102, a photoresist 101 described above is formed in a layer by using a spin coater or the like (FIG. 1(a)). The layer thickness of the photoresist 101 at this time is set so that it can resist a decrease in thickness during dry etching of the substrate 102 with gas with respect to an intended depth of etching of the substrate 102.

Then, at the surface of the photoresist 101, silylation is effected (FIG. 1(b)). The silylation may be effected in a vapor phase or a gas phase.

As a silylation agent 103, it is possible to use HMDS (hexamethyldisilazane), DMSDEA (dimethylsilyldiethylamine), TMDS (tetramethyldisilazane), TMSDMA (trimethylsilyldimethylamine), DMSDMA (dimethylsilyldimethylamine), TMSDEA (trimethylsilyldiethylamine), HMCTS (hexamethylcyclotrisilaxane), B[DMA]MS (bis(dimethylamino)methylsilane), and B[DMA]DS (bis(dimethylamino)dimethylsilane).

In the case of liquid-phase silylation, a diffusion accelerator and a solvent may be used in combination with the silylation agent described above, as desired. As the diffusion agent, it is possible to use DGM (dimethyleneglycol dimethyl ether), NMP (N-methyl-2-pyrrolidone), and PGMEA (propylene glycol methyl ether acetate). As the solvent, it is possible to use xylene, n-decane and n-heptane.

The depth of pattern which can be formed by near-field exposure corresponds to approximately a minimum opening diameter of a mask used at the time of exposure, so that a silylation condition may appropriately be adjusted to provide the thickness of silylation portion 104, i.e., the silylation depth of not more than the minimum opening diameter. The silylation condition may include the kind of silylation agent, a temperature, an atmospheric pressure, a time, etc., for the vapor-phase silylation, and the kind of silylation agent, a concentration of silylation agent, a concentration of silylation accelerator, a temperature, a time, etc., for the liquid-phase silylation.

Figure 2:
FIG. 2 is a reaction scheme showing silylation reaction of novolac resin in an embodiment of the present invention.

By the silylation, in the photoresist 101, it is considered that such a reaction shown in FIG. 2 is caused to occur. By this reaction, the silylation portion 104 is formed at an upper layer portion of the photoresist 101.

The thus formed silylation portion 104 is subjected to near-field exposure (FIG. 1(c)).

In this embodiment, simultaneous exposure using a photomask is employed but near-field exposure may be effected by using a near-field probe etc.

Referring to FIG. 1(c), incident light 105 incident from an exposure light source such as a mercury lamp enters a small opening 108 provided m a light blocking film 107 through a mask base material 106. In the vicinity of the small opening 108, near-field light 109 is created. The mask is brought immediately near to the photoresist 101, whereby the silylation portion gets near to such a range in which the near-field light 109 is present. As a result, it is possible to form a latent image pattern at the silylation portion 104 as the upper layer of the photoresist 101.

Here, by the near-field exposure, it is considered that the following reaction occurs in the silylation portion 104.

Figure 3:
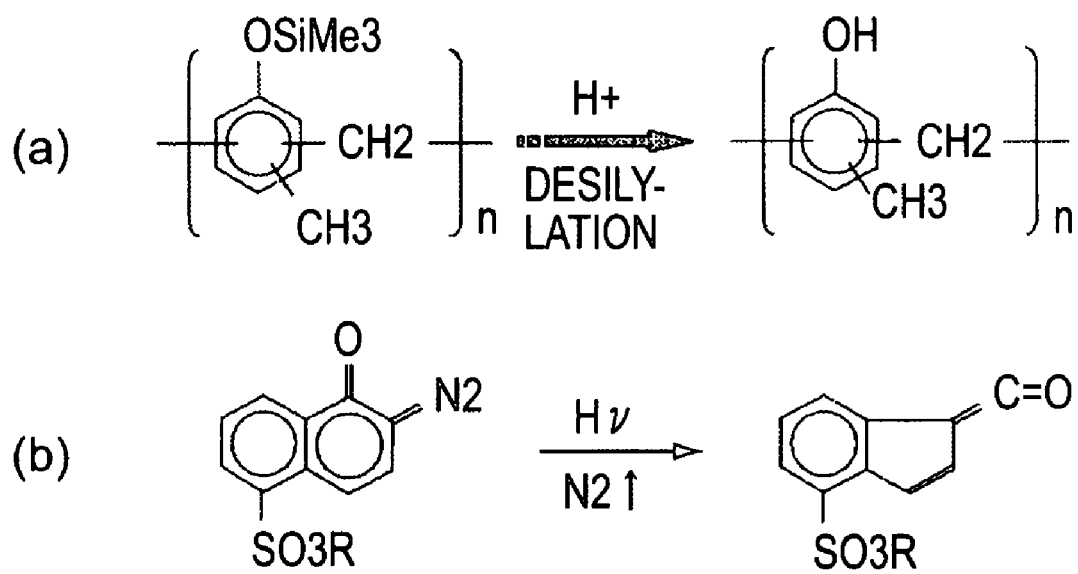
FIGS. 3(a) and 3(b) are reaction schemes showing a reaction at an exposure portion in an embodiment of the present invention.
Figure 4:
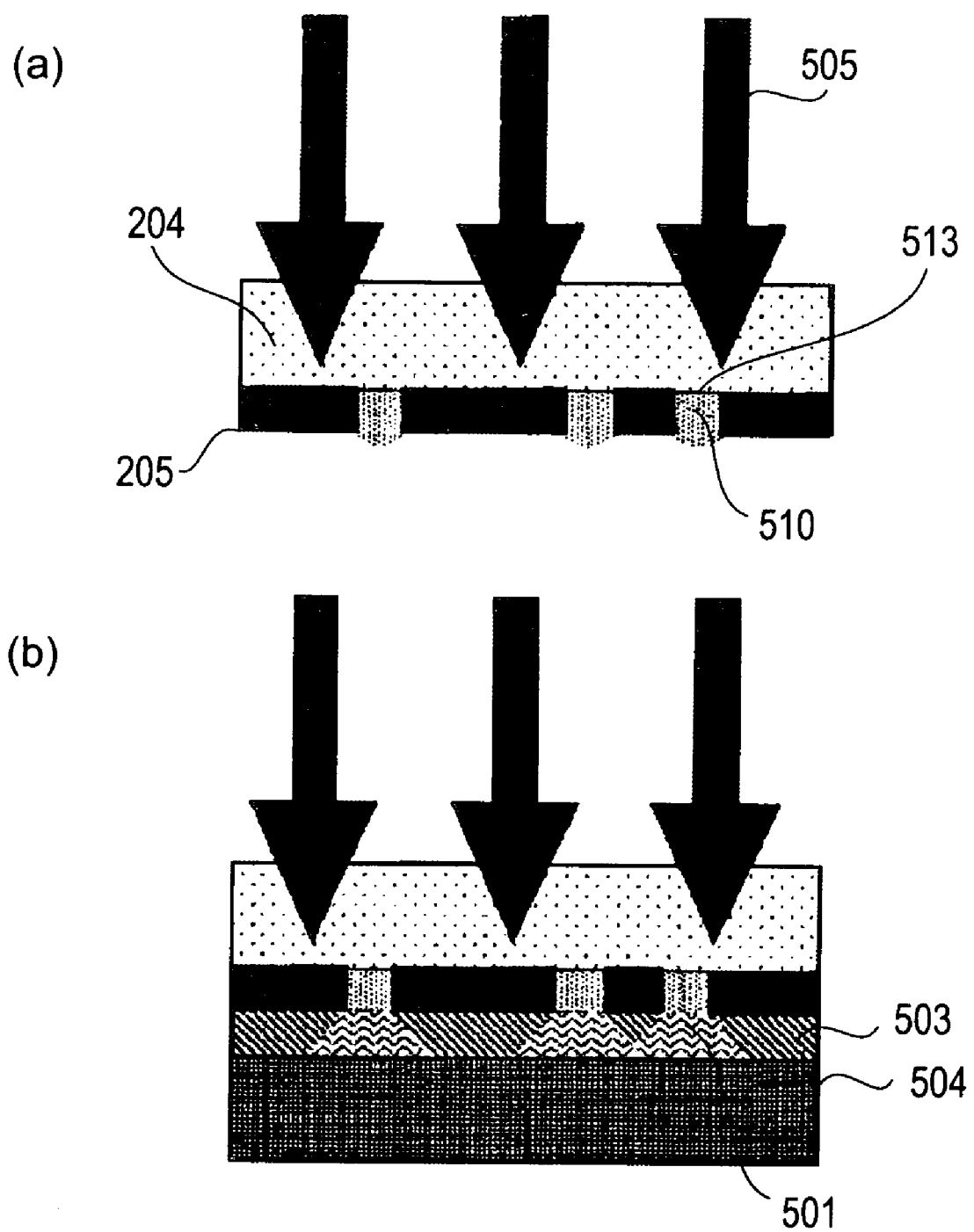
FIGS. 4(a) and 4(b) are views showing a state of exposure of a thicker photoresist to light for illustrating a problem to be solved by the present invention.

By the near-field exposure, acid is generated from the photoacid generator, and by the acid, desilylation of the silylated novolac resin is caused to occur (FIG. 3(a)) and the sensitizer is changed into ketene (FIG. 3(b)).

Thereafter, PEB (post exposure bake) is effected. The PEB may be effected in a water vapor atmosphere as desired.

Then, alkali development is performed. By performing the alkali development, the following phenomenon occurs.

At an exposed potion, the novolac resin which has been desilylated is dissolved, and the photosensitizer which has been changed into the ketene is changed into indene carboxylic acid to be dissolved in an alkaline developer. The indene carboxylic acid is considered that it accelerates the dissolution of he novolac resin, so that the dissolution speed in the alkaline developer is increased when compared with the case of the novolac resin alone.

On the other hand, at an unexposed portion, the silylated novolac resin itself is not readily dissolved in the alkaline developer. Further, an unreacted photosensitizer which has not been exposed to light creates a linking state with the novolac resin to have a dissolution suppression effect in the alkaline developer, so that the novolac resin is not further dissolved readily in the alkaline developer. Further, when an onium salt is used as the photoacid generator, the onium salt suppresses the dissolution of the novolac resin in the alkaline developer.

For these reasons, a contrast of image between the exposed portion and the unexposed portion is increased by the use of the photoresist according to the present invention. As a result, in the case where a fine pattern of a line width of several ten nanometers is formed by near-field exposure, it becomes possible to form a fine pattern at a relatively shallow depth-silylation portion 104 with a good contrast. Accordingly, in a subsequent process, it is possible to ensure a tolerance.

By the alkali development described above, the latent image pattern is developed by the near-field exposure to provide a surface uneven pattern of the photoresist with a good contrast (FIG. 1(d)).

Next, resist etching is effected up to the substrate 102 by dry etching with oxygen gas through the surface uneven pattern of the photoresist as a mask (FIG. 1(e)).

The novolac resin at the unexposed portion contains silicon atom by the silylation, and the silicon atom reacts with oxygen gas to provide silicon oxide, so that an oxygen dry etching resistance is considerably enhanced compared with the photoresist on the substrate 102 side. Further, the uneven pattern formed at the silylation portion 104 is formed with a good contrast, so that a pattern having a good contrast and a high aspect ratio is also transferred onto the photoresist 110.

By using the above prepared resist pattern as a photomask, etching of the substrate 102 with gas capable of etching the substrate 102 is effected (FIG. 1(f)).

The fine pattern is also well transferred onto the substrate 102 by etching since the resist pattern on the substrate 102 is formed with a good contrast at a high aspect ratio.

EXAMPLE

In order to form a 50 nm L/S (line and space) pattern of a 100 nm-thick upper Si layer on $SiO_2$ layer of SOI (silicon on insulator) substrate, a photoresist was formed on the SOI substrate by spin coating.

The photoresist contained an alkali-soluble novalac resin, a photosensitizer having a naphthoquinonediazide group, triazine and a sensitizer.

With respect to the thickness of the photoresist layer, it is necessary to provide the photoresist layer on the SOI substrate with a thickness of to less than 50 nm in view of a ratio of etching resistance between Si and the photoresist with respect to a mixture gas of $CHF_3$ and $SF_6$ since Si is etched with the mixture gas. Further, in order to form the 50 nm L/S pattern by near-field exposure, a width of a small opening of the photomask used in the near-field exposure is approximately 20 nm. For this reason, a thickness of the silylation portion is determined as 20 nm.

When a 20 nm-thick silylation portion is used as the photomask for dry etching, it is possible to perpendicularly etch a 100 nm-thick photoresist layer with oxygen gas.

Accordingly, in order to ensure a process tolerance during the etching of Si, the thickness of the photoresist layer applied onto the SOI substrate was set to 100 nm in view of the above described photoresist layer thickness condition.

Thereafter, the entire surface of the photoresist was silylated by a liquid-phase silylation. As the silylation agent, a mixture of HMCTS and a diffusion accelerator dissolved in n-decane was used. The liquid-phase silylation was effected by immersing the substrate coated with the photoresist in the liquid-phase silylation agent at room temperature, thus forming a 20 nm-thick silylation portion.

Then, near-field exposure was performed in the following manner.

A photomask having a light blocking portion which was provided with a pattern of 100 nm in pitch and 20 nm in small opening width was caused to intimately contact the photoresist at its entire surface, followed by exposure to light by a mercury lamp to form a latent image. Thereafter, PEB was performed in water vapor atmosphere and development was performed by immersing the substrate in the alkaline developer.

As described above, the photoresist contained the photoacid generator and the photosensitizer, so that it was possible to form a pattern having a good contrast between the exposed and unexposed portions and a good rectangular shape.

By using the photoresist pattern formed at the silylation portion was a mask, the photoresist was dry-etched with oxygen gas up to an interface with the Si substrate. As a result, since the pattern at the silylation portion was formed with a very good contrast, a good photoresist pattern was formed although the silylation portion had a smaller thickness of 20 nm.

By using the resultant photoresist pattern as a mask for dry etching, dry etching of the Si substrate with a mixture gas of $CHF_3$ and $SF_6$ was performed. Since the photoresist pattern was very good, it was possible to form a 50 nm L/S pattern having a depth of 100 nm on the insulating material with a tolerance for the dry etching process of Si.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 298973/2003 filed Aug. 22, 2003, which is hereby incorporated by reference.

What is claimed is:

1. A fine pattern forming method for transferring a fine pattern onto a workpiece substrate by means of an exposure mask provided with the fine pattern, comprising:
   a step of preparing the exposure mask provided with the fine pattern;
   a step of preparing a near-field exposure photoresist comprising an alkali-soluble novolac resin, a diazide-type photosensitizer which is photoreactive by near-field exposure, a photoacid generator which generates acid by the near-field exposure, and a solvent;
   a step of disposing the near-field exposure photoresist on the workpiece substrate;
   a step of silylating an upper layer portion of the near-field exposure photoresist;
   a step of forming a fine pattern at the silylated portion of the photoresist by effecting the near-field exposure; and
   a step of forming a fine pattern on the workpiece substrate on the basis of the fine pattern formed at the silylated portion.

2. A fine pattern forming method, comprising:
   a step of applying on a workpiece substrate a near-field exposure photoresist comprising an alkali-soluble novolac resin, a diazide-type photosensitizer which is photoreactive by near-field exposure, a photoacid generator which generates acid by the near-field exposure, and a solvent;
   a step of silylating an upper layer portion of the photoresist in a vapor phase or a liquid phase;
   a step of forming a latent image pattern at the silylated portion of the photoresist by exposing the silylated portion to near-field light;
   a step of developing the latent image pattern formed at the silylated portion with alkali developer;
   a step of transferring the developed pattern at the silylated portion onto the photoresist in a thickness direction of the photoresist by oxygen dry etching; and
   a step of transferring the transferred photoresist pattern onto the substrate by dry etching.

3. A method according to claim 2, wherein in said silylating step, the thickness of the silylated portion is not more than a size of an opening diameter of a small opening of a mask for use in near-field exposure.

4. The method according to claim 1, wherein said alkali-soluble novolac resin has been synthesized through condensation of a phenol component with an aldehyde component in the presence of an acid catalyst.

5. The method according to claim 1, wherein said diazide-type photosensitizer is a compound capable of being synthesized through esterification between a polyhydroxy compound and quinonediazide sulfonic acid as a photosensitive group.

6. The method according to claim 1, wherein said photoacid generator is an onium salt or triazine.

7. The method according to claim 1, wherein said solvent is a single solvent or a mixture solvent selected from the group consisting of propylene glycol monomethyl ether acetate, ethyl lactate, butyl acetate, and 2-heptanone.

8. The method according to claim 2, wherein said alkali-soluble novolac resin has been synthesized through condensation of a phenol component with an aldehyde component in the presence of an acid catalyst.

9. The method according to claim 2, wherein said diazide-type photosensitizer is a compound capable of being synthesized through esterification between a polyhydroxy compound and quinonediazide sulfonic acid as a photosensitive group.

10. The method according to claim 2, wherein said photoacid generator is an onium salt or triazine.

11. The method according to claim 2, wherein said solvent is a single solvent or a mixture solvent selected from the group consisting of propylene glycol monomethyl ether acetate, ethyl lactate, butyl acetate, and 2-heptanone.

* * * * *

UNITED STATES PATENT AND TRADEMARK OFFICE
CERTIFICATE OF CORRECTION

PATENT NO.         : 7,022,463 B2
APPLICATION NO. : 10/921184
DATED                 : April 4, 2006
INVENTOR(S)       : Yamaguchi et al.

It is certified that error appears in the above-identified patent and that said Letters Patent is hereby corrected as shown below:

TITLE PAGE:
Item (56) References Cited, U.S. PATENT DOCUMENTS,
"6,721,040 B1" should read -- 6,721,040 B2 -- and
"6,849,391 B1" should read -- 6,849,391 B2 --.

Item (56) References Cited, FOREIGN PATENT DOCUMENTS,
"1077051 *3/1988" should read -- 64-77051 *3/1989 --;
"3225343" should read -- 3-225343 --;
"5232695" should read-- 5-232695 --; and
"6348039" should read-- 6-348039 --.

Item (57) ABSTRACT,
Line 2, "novalac" should read -- novolac --; and
Line 3, "diazyde-type" should read -- diazide-type --.

COLUMN 1:
Line 8, "an near-field" should read -- a near-field--;
Line 16, "a ultraviolet" should read -- an ultraviolet--;
Line 39, "an light source" should read -- a light source --;
Line 48, "patternwidth" should read -- pattern width --; and
Line 49, "shows" should read -- show --.

COLUMN 3:
Line 3, "an near-field" should read -- a near-field--;
Line 53, "synthesized" should read -- synthesizing --;
Line 55, "nova-" should read -- novo- --; and
Lines 62 and 67, "novalac" should read -- novolac --.

COLUMN 4:
Lines 20, 44, 47 and 57, "novalac" should read -- novolac --.

COLUMN 5:
Line 11, "(hexamethylcyclotrisilaxane)" should read --(hexamethylcyclotrisiloxane) --;
Line 44, "m a" should read -- in a --;
Line 62, "potion," should read -- portion, --; and
Line 67, "of he" should read -- of the --.

COLUMN 6:
Line 24, "a surface uneven" should read -- an uneven surface --;
Line 27, "surface uneven" should read -- uneven surface --; and
Line 52, "novalac" should read -- novolac --.

UNITED STATES PATENT AND TRADEMARK OFFICE
CERTIFICATE OF CORRECTION

PATENT NO.       : 7,022,463 B2
APPLICATION NO.  : 10/921184
DATED            : April 4, 2006
INVENTOR(S)      : Yamaguchi et al.

It is certified that error appears in the above-identified patent and that said Letters Patent is hereby corrected as shown below:

COLUMN 7:
Line 28, "was" should read -- as --.

Signed and Sealed this

Ninth Day of January, 2007

JON W. DUDAS
*Director of the United States Patent and Trademark Office*